(12) United States Patent
Tonami et al.

(10) Patent No.: US 7,316,783 B2
(45) Date of Patent: *Jan. 8, 2008

(54) METHOD OF WIRING FORMATION AND METHOD FOR MANUFACTURING ELECTRONIC COMPONENTS

(75) Inventors: Yoshiyuki Tonami, Shiga-ken (JP); Yoshihiro Koshido, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 374 days.

This patent is subject to a terminal disclaimer.

(21) Appl. No.: 10/885,306

(22) Filed: Jul. 7, 2004

(65) Prior Publication Data

US 2004/0245110 A1  Dec. 9, 2004

Related U.S. Application Data

(63) Continuation of application No. 09/761,317, filed on Jan. 17, 2001, now Pat. No. 6,808,641.

(30) Foreign Application Priority Data

Jan. 17, 2000  (JP) .............................. 2000-008247

(51) Int. Cl.
*H01L 21/00* (2006.01)
*H01L 21/3205* (2006.01)
*C25D 5/00* (2006.01)

(52) U.S. Cl. .................. 216/13; 216/18; 216/40; 216/100; 205/80; 205/123; 205/125; 205/223; 205/169; 205/157; 205/186; 438/727; 438/643; 438/648; 438/653

(58) Field of Classification Search ............... 216/13, 216/18, 40, 100; 205/80, 123, 125, 169, 205/157, 223, 186; 438/727, 643

See application file for complete search history.

(56) References Cited

U.S. PATENT DOCUMENTS

| | | | |
|---|---|---|---|
| 4,293,637 | A | 10/1981 | Hatada et al. |
| 5,080,763 | A | 1/1992 | Baigetsu |
| 5,336,929 | A | 8/1994 | Hayashi |
| 5,550,068 | A | 8/1996 | Hirano et al. |
| 5,679,234 | A | 10/1997 | Imamura |

FOREIGN PATENT DOCUMENTS

| | | |
|---|---|---|
| JP | 02-139934 A | 5/1990 |
| JP | 04-262536 A | 9/1992 |
| JP | 6-260482 | 9/1994 |

*Primary Examiner*—Ram N. Kackar
(74) *Attorney, Agent, or Firm*—Keating & Bennett, LLP (57) ABSTRACT

A method of wiring formation includes forming a feeder film partially on a substrate, forming on the substrate a plating base film via a physical film making method so that the plate base film partially overlaps the feeder film, forming a plated wiring on the plating base film using an electrolytic plating, and selectively removing at least an area of the feeder film which is exposed from the plated wiring, using a wet etching process.

22 Claims, 9 Drawing Sheets

METHOD OF WIRING FORMATION AND METHOD FOR MANUFACTURING ELECTRONIC COMPONENTS

This application is a Continuation Application of U.S. patent application Ser. No. 09/761,317 filed Jan. 17, 2001, now U.S. Pat. No. 6,808,641.

BACKGROUND OF THE INVENTION

1. Field of the Invention

The present invention relates to methods of wiring formation and manufacturing electronic components, and more specifically, it relates to methods of fine wiring formation using a semi-additive process.

2. Description of the Related Art

In semiconductor integrated circuits, semiconductor devices, wiring substrates, etc., fine and low-resistance wiring patterns are necessary. Therefore, an aspect ratio (wiring thickness/wiring width) of the wiring pattern must be large. In order to form a wiring pattern having a high aspect ratio, a semi-additive process has been generally used.

Figure 1A:
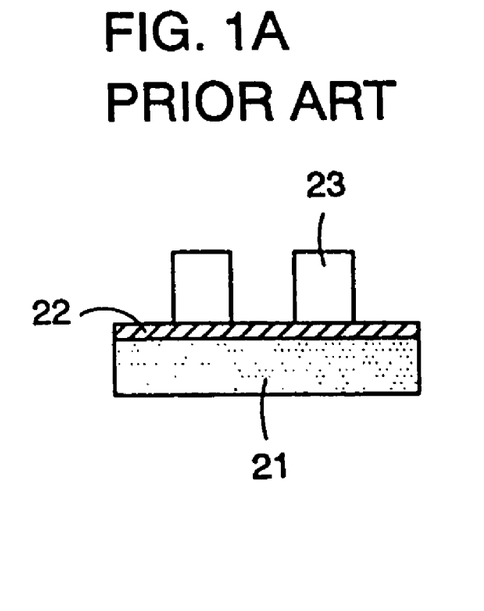
FIGS. 1A to 1D are sectional outline views for explaining a method of fine wiring formation according to a conventional semi-additive process.

A method of formation of the wiring pattern by the conventional semi-additive process is shown in FIGS. 1A to 1D. A feeder film 22 is formed on the entire surface of the substrate 21, thereafter a photoresist is coated thereon. Then, the photoresist is patterned to form a resist pattern 23, for a selective electrolytic plating, on the feeder film 22 as shown in FIG. 1A. As the feeder film 22, generally, a two-layer film composed of an upper layer made of Cu and a lower layer made of Ti, is used in the case of Cu plating, and an upper layer made of Pd and a lower layer made of Ti, is used in the case of Au plating.

Figure 1B:
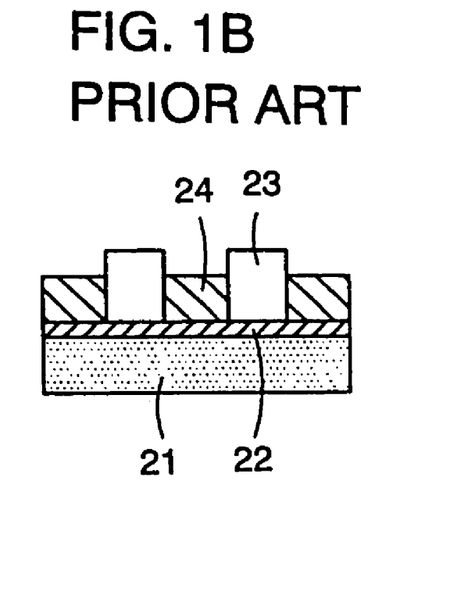
Figure 1C:
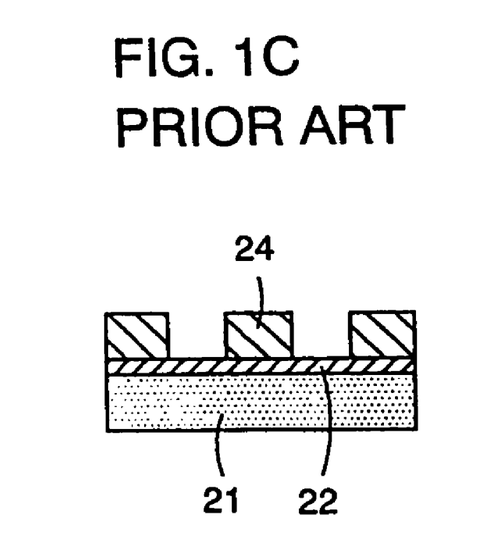

Then, by immersing the substrate 1 into an electrolytic plating solution, and passing a current through the feeder film 22 as an electrolytic plating electrode, as shown in FIG. 1B, the plating metal is deposited on the feeder film 22 in an area exposed from the resist pattern 23, and a plated wiring 24 is formed. After the completion of the electrolytic plating, the substrate 21 is washed, then, the resist pattern 23 is peeled away as shown in FIG. 1C.

Figure 1D:
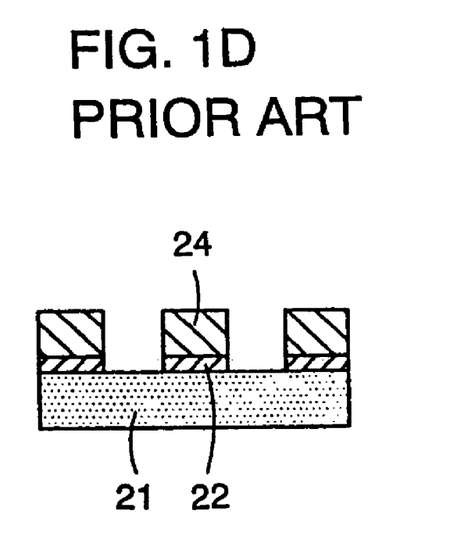

Thereafter, by completely etching the feeder film 22 exposed from the plated wiring 24, the wiring pattern, having a desired pattern, composed of the feeder film 22 and the plated wiring 24 as shown in FIG. 1D is obtained.

In the aforementioned method of fine wiring formation, as shown in FIG. 1D, the exposed portion of the feeder film 22 is removed by the etching after forming the plated wiring 24, and dry etching or wet etching methods are used.

The dry etching methods include ion milling, reactive ion etching (RIE), and others. By using these methods, it is possible to form the fine wiring pattern in which the line and space (hereafter described as L/S) is 5 μm or less.

In the dry etching methods, however, expensive apparatuses are required, and therefore, the manufacturing cost is very high. Furthermore, in the ion milling, it is not possible to selectively etch only the feeder film, but the plated wiring and the substrate are etched together with the feeder film so that problems of etching residues and substrate damage occur. In the reactive ion etching, there is a problem in that a suitable material for the feeder film has not been identified.

On the other hand, in the wet etching methods, hydrofluoric acid is used in the case of the feeder film made of Cu or Ti, and a mixture of nitric acid and hydrochloric acid is used in the case of the feeder film made of Pd. The wet etching methods is very low in the cost compared to the dry etching methods, and it is easy to selectively etch only the feeder film.

Figure 2:
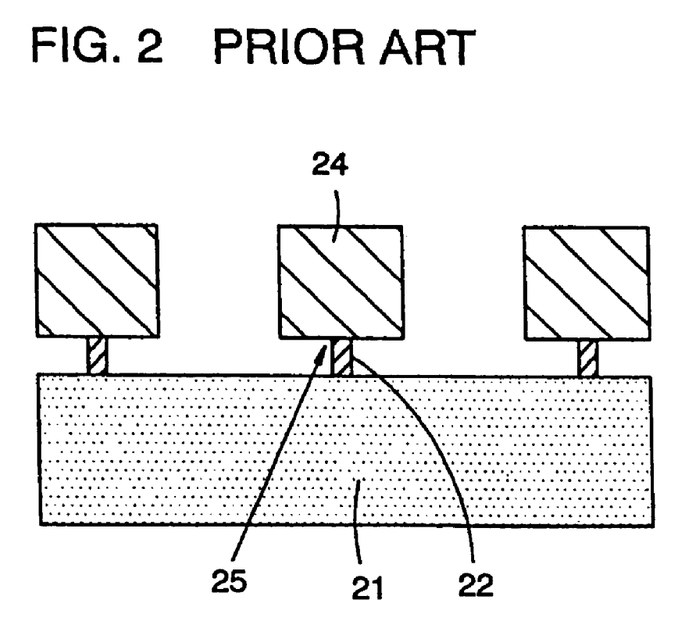
FIG. 2 is a drawing for explaining problems in the method of fine wiring formation according to the conventional semi-additive process.

Because the wet etching is isotropic, however, when the feeder film 22 is wet etched, as shown in FIG. 2, the feeder film 22 under the plated wiring 24 is also side-etched to cause an undercut 25 under the plated wiring 24 so that defects such as insufficient adhesion and peeling of the wiring may be caused. Therefore, in the wet etching, there is a limit in accuracy at L/S=5 μm to 10 μm, and then a fine wiring in which the L/S is 5 μm or less could not been obtained.

SUMMARY OF THE INVENTION

In order to overcome the problems described above, preferred embodiments of the present invention provide a method of wiring formation wherein fine wiring is accurately formed by the semi-additive process using wet etching to remove the feeder film, and to provide an electronic component.

According to one preferred embodiment of the present invention, a method of wiring formation includes the steps of forming a feeder film partially on a substrate, forming on the substrate a plating base film by using a physical film making method such that the plate base film partially overlaps the feeder film, forming a plated wiring on the plating base film using an electrolytic plating, and selectively removing at least an area of the feeder film which is exposed from the plated wiring, using a wet etching.

The types of substrates used in the methods of preferred embodiments of the present invention are not particularly limited, and semiconductor integrated circuits and semiconductor devices, semiconductor substrates and ceramic substrates for wiring substrates, glass epoxy substrates, and other suitable substrates may be used.

The step of forming the plating base film on the substrate such that the plating base film has a desired pattern, may include forming a substrate metal on the entire substrate, thereafter by etching the substrate metal, or the plating base film may be formed by a lift-off method after depositing the substrate metal on the substrate from above a resist pattern.

According to preferred embodiments of the present invention, because the plating base film is formed so as to overlap the feeder film on the substrate using the physical film making method, and the plated wiring is formed thereon, even if all of the feeder film were removed by etching during the etching of the feeder film, only a portion of the plating base film is caused to be elevated and separated from the substrate due to an undercut and a space caused in a portion of the plating base film, most of the plating base film is not peeled off the substrate. Therefore, the process is usable for wiring patterns containing patterns of fine wire width, so that it becomes possible to form wiring patterns of fine wire width by using the semi-additive process in which the feeder film is removed using wet etching.

Preferred embodiments of the present invention include the case in which the steps are applied to a portion of the wiring pattern. For example, a conventional method may be used for a portion containing relatively wide wire width, and the methods of preferred embodiments of the present invention may be applied only to a portion containing fine wire width.

According to another preferred embodiment of the present invention, the method of wiring formation includes the steps of forming a feeder film partially on a substrate, forming on the substrate a resist pattern which has an opening defining a wiring forming area, such that a portion of the feeder film is exposed by the opening of the resist pattern, forming a plating base film at least on the substrate in the opening using a physical film making method, forming a plated wiring on the plating base film in the opening using an electrolytic plating, removing the resist pattern, and selectively removing at least an area in the feeder film which is exposed from the plated wiring, using a wet etching.

According to the method of this preferred embodiment, because the feeder film is exposed in a portion of the opening portion of the resist pattern, and the plating base film is formed at least in the opening of the resist pattern using the physical film making method, the plating base film can be formed to overlap the feeder film by the plating base film, even if all of the feeder film were removed by etching during the etching of the feeder film, only a portion of the plating base film is elevated and separated from the substrate due to an undercut caused in a portion of the plating base film, and the plating base film is not peeled off the substrate. Therefore, the steps of this method are usable for wiring patterns containing patterns of fine wire width, so that it becomes possible to form wiring patterns of fine wire width by the semi-additive process in which the feeder film is removed using the wet etching.

In addition, because the plated wiring is grown in the opening portion of the resist pattern, the plating metal is not deposited outside of the opening portion, and the pattern precision of the plated wiring is greatly improved.

It is preferable that a width of a portion of the plate base film that is stacked on the feeder film is wider than the smallest wire width of the feeder film.

In this case, because the wire width of the portion of the plating base film stacked on the feeder film is wider, even if an undercut were caused in the portion being stacked on the plating base film during the etching of the feeder film, the plating base film can be prevented from being completely elevated and separated from the substrate, and the adhesiveness between the plating base film and the substrate is greatly improved.

The plating base film may include an adhesive layer of a diffusion preventive layer as a lower layer. In this case, it is possible to improve the adhesiveness between the plating base film and the substrate or to prevent the plating base film from being diffused into the substrate.

The methods of preferred embodiments of the present invention are suitably applied to various methods for manufacturing electronic components, especially electronic components having fine wiring patterns and used for a high frequency application.

For the purpose of illustrating the present invention, there is shown in the drawings several forms that are presently preferred, it being understood, however, that the invention is not limited to the precise arrangements and instrumentalities shown.

Other features, elements, characteristics and advantages of the present invention will become more apparent from the detailed description of preferred embodiments below with reference to the attached drawings.

DETAILED DESCRIPTION OF PREFERRED EMBODIMENTS

Hereinafter, preferred embodiments of the present invention are explained in detail with reference to the drawings.

The first preferred embodiment will be explained with reference to FIGS. 3A to 3G, 4A to 4C, 5A to 5C, 6A to 6C, 6A to 6C, 8A to 8C and 9A to 9C.

Figure 3A:
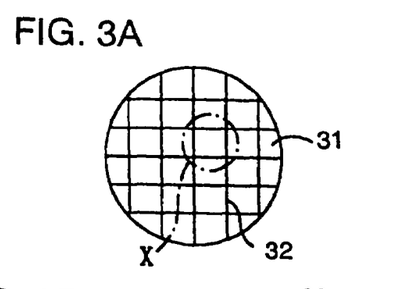
FIGS. 3A to 3G are drawings for explaining a method of fine wiring formation according to a preferred embodiment of the present invention.
Figure 3B:
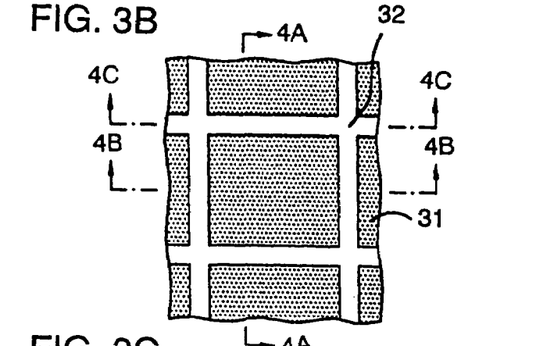
Figure 4A:
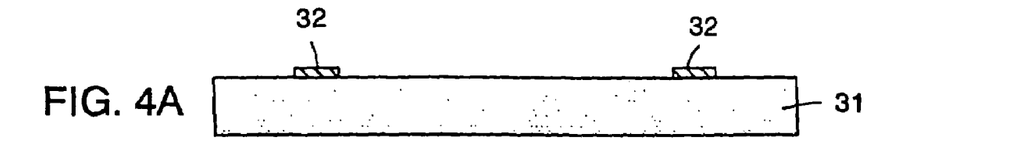
FIGS. 4A to 4C are sectional views taken along lines 4A-4A, 4B-4B and 4C-4C in FIG. 3B, respectively.
Figure 4B:
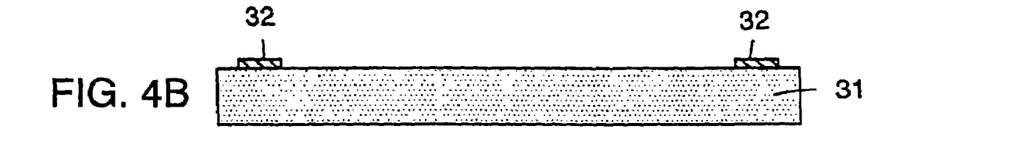
Figure 4C:
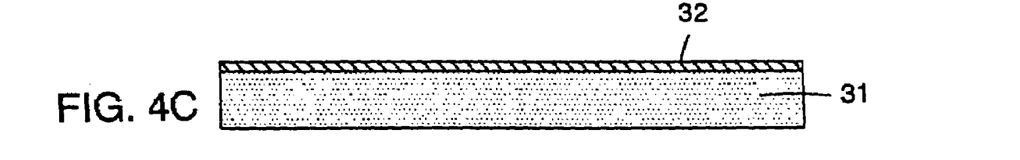

A Ti film having a thickness of, for example, approximately 100 nm is formed using sputtering on the entire surface of a substrate 31 (for example, mirror finish alumina substrate having a diameter of about 3 inches), and successively a Cu film having a thickness of, for example, about 100 nm is formed on the Ti film. Then, a photoresist is coated on the Cu film, and this photoresist is patterned via photolithography to obtain a resist pattern in the shape of a feeder film pattern. By the wet etching with hydrofluoric acid using the resist pattern as a mask, a feeder film 32, having a desired pattern, including an upper layer preferably made of Cu and a lower layer preferably made of Ti is formed on the substrate 31. An example of the pattern of such a feeder film 32 is shown in FIG. 3A, and a magnified portion X thereof is shown in FIG. 3B. Sectional views of FIG. 3B are shown in FIGS. 4A to 4C.

The pattern of the feeder film 32 shown herein is an example of an appropriately selected arbitrary pattern that can be used in preferred embodiments of the present invention. The pattern wire width of the feeder film 32 should substantially match the width required to function as a feed line in the electrolytic plating. A material for the feeder film 32 is not particularly specified. The material, however, having good adhesiveness to the substrate 31 is preferable. In order to pattern the feeder film 32, an etching method may be used but other methods such as a lift-off method, a patterning method in which a metallic mask is used during the vapor deposition or sputtering, may also be used. The feeder film having a desired pattern may be formed using screen printing.

Figure 3C:
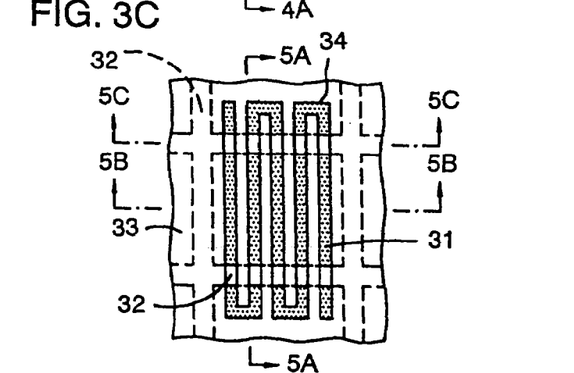
Figure 5A:
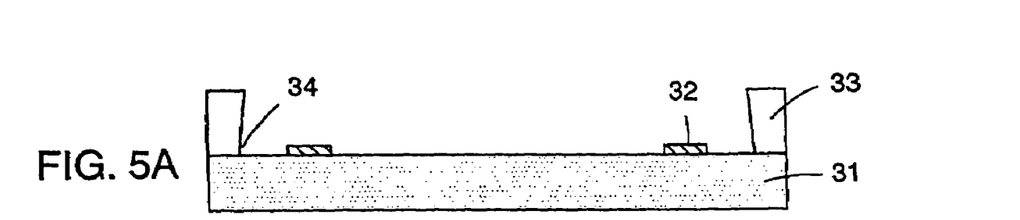
FIGS. 5A to 5C are sectional views taken along lines 5A-5A, 5B-5B and 5C-5C in FIG. 3C, respectively.
Figure 5B:
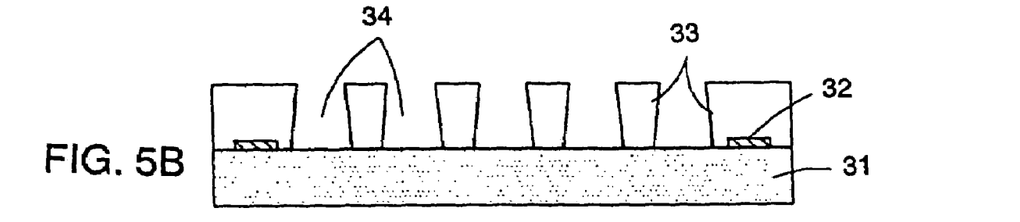
Figure 5C:
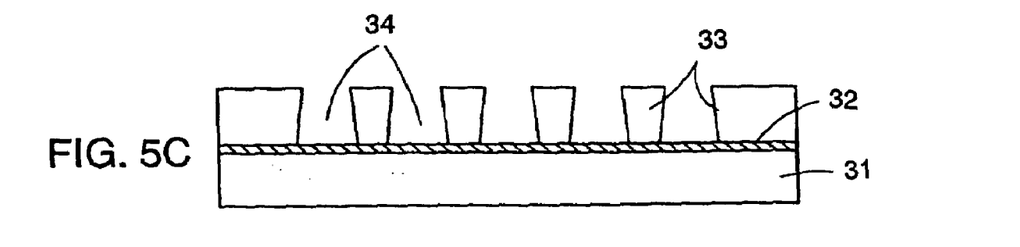

Next, a photoresist 33 is coated on the entire surface of the substrate 31 from above the feeder film 32, and this is patterned via photolithography to form an opening 34 in the photoresist 33. This opening 34 preferably has substantially the same shape as a plated wiring pattern being manufactured. The state in which the opening 34 is thus made in the photoresist 33 is shown in FIG. 3C, and sectional views thereof are shown in FIGS. 5a to 5c.

Herein, in every opening 34 for forming the plated wiring pattern, the feeder film 32 is from the opening 34, and furthermore, a portion of the feeder film 32 is exposed from only a portion of the opening 34. The photoresist 33 preferably has a reverse tapered shape as viewed in the cross section thereof.

Figure 3D:
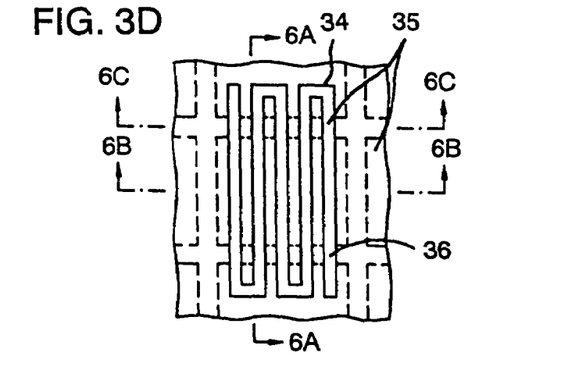
Figure 6A:
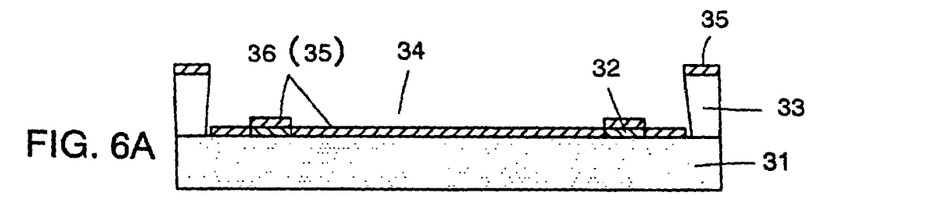
FIGS. 6A to 6C are sectional views taken along lines 6A-6A, 6B-6B and 6C-6C in FIG. 3D, respectively.
Figure 6B:
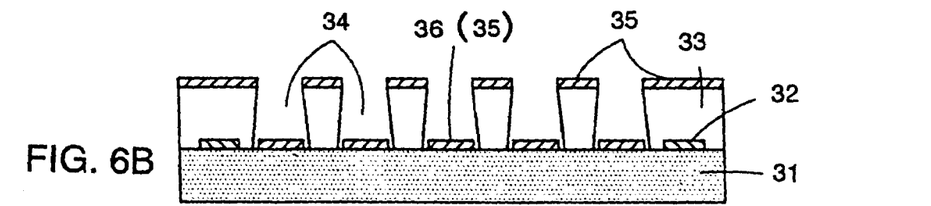
Figure 6C:
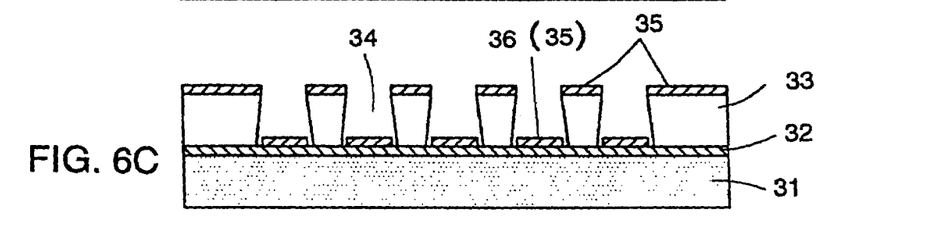

Then, NiCr is deposited to be, for example, about 50 nm in film thickness on the entire surface of the substrate 31 from above the photoresist 33 using a vapor deposition method, a sputtering method, or other methods, an Au film having a thickness of, for example, about 100 nm is formed on the NiCr film, and a plating base film 35 including an upper layer preferably made of Au and a lower layer preferably made of NiCr is formed on the substrate 31. In this plating base film 35, the portion set up in the opening 34 and on the substrate 31 (a plating base film 36) preferably has substantially the same pattern shape as the plated wiring pattern. The plating base film 36 is electrically conducted to the feeder film 32. The state in which the plating base film 35 is thus formed on the substrate 31 is shown in FIG. 3D, and sectional views thereof are shown in FIGS. 6A to 6C.

The plating base film 35 is not limited to the aforementioned materials, and a plate base film on which plating metals can be deposited may be used. For example, Cu, Au, Ni, Pd, Pt are usable, and alloys or multi-layer films thereof are usable. Furthermore, thereunder, an adhesive layer to improve the adhesiveness to the substrate, a diffusion preventive layer (barrier metal layer) to prevent the material of the plating base film 36 from diffusing into the substrate 31, and other such layers may be formed. The total film thickness of the plating base film 36 is preferably about 0.1 μm to about 1 μm on average. Herein, in the case in which the film thickness of the plating base film 36 is close to the lower limit (approximately 0.1 μm), the thin film material may be adhered in various locations instead of being a continuous film. The plating base film 36 may be patterned via etching. The plating base film 36 can also be easily patterned via the lift-off using the photoresist 33.

Figure 3E:
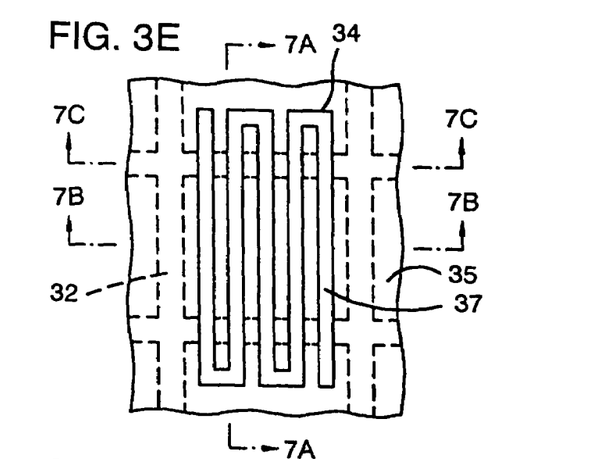
Figure 7A:
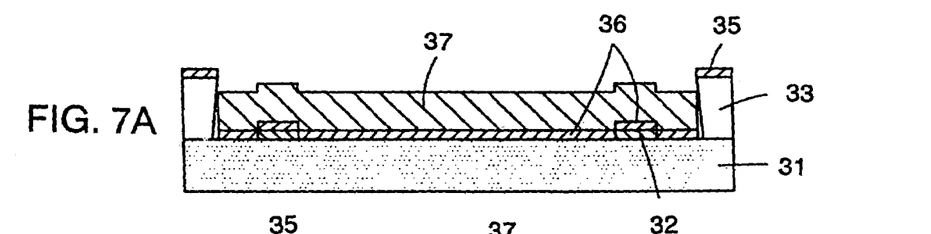
FIGS. 7A to 7C are sectional views taken along lines 7A-7A, 7B-7B and 7C-7C in FIG. 3E, respectively.
Figure 7B:
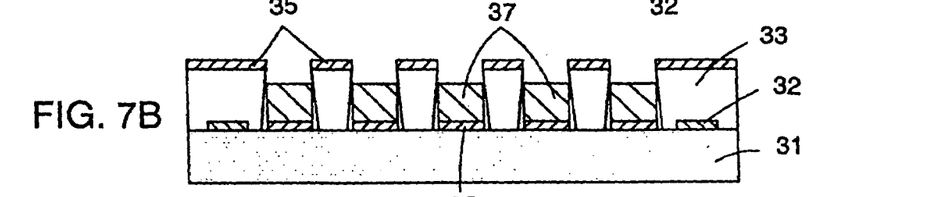
Figure 7C:
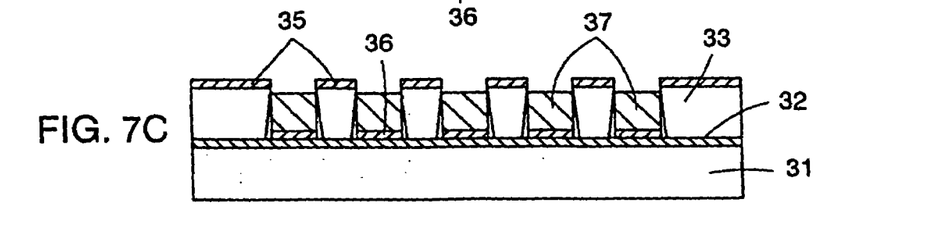

Thereafter, the whole substrate 31 is immersed into an Au plating bath, a negative terminal of a power source for the electrolytic plating is connected to the feeder film 32, a positive terminal is connected to a platinum electrode in the Au plating bath, and a current is applied. Accordingly, the plating metal Au is deposited on the plating base film 36 formed in the opening 34 of the photoresist 33. When an Au plated wiring having the desired thickness is obtained, the current is stopped, and the whole substrate 31 is washed with purified water and is dried. The state in which the Au plated wiring 37 is thus formed on the plating base film 36 in the opening 34 is shown in FIG. 3E, and sectional views thereof are shown in FIGS. 7A to 7C.

Because the photoresist 33 is formed to be adversely tapered and both shoulder portions thereof are arranged to jut out so to as create an overhang, the plating base film 36 on the substrate 31 and the plating base film 35 defining an upper surface of the photoresist 33 are prevented from being connected to each other due to the adhering of the plating base film 35 to the side surface of the photoresist 33, and the plating metal is prevented from being deposited on the plating base film 35 defining an upper surface of the photoresist 33.

Figure 3F:
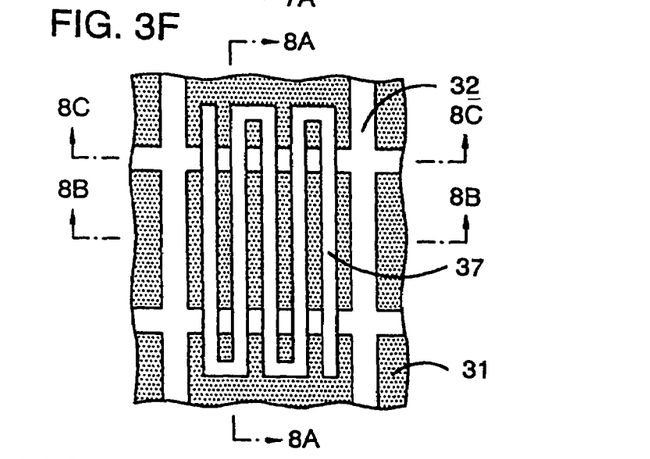
Figure 8A:
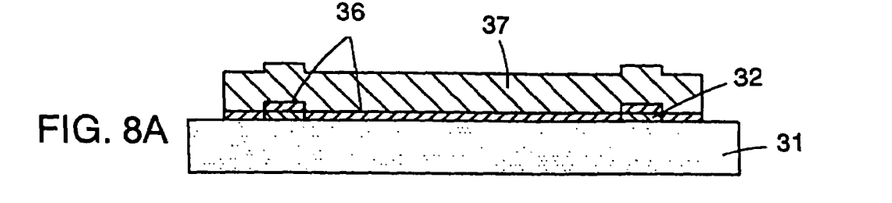
FIGS. 8A to 8C are sectional views taken along lines 8A-8A, 8B-8B and 8C-8C in FIG. 3F, respectively.
Figure 8B:
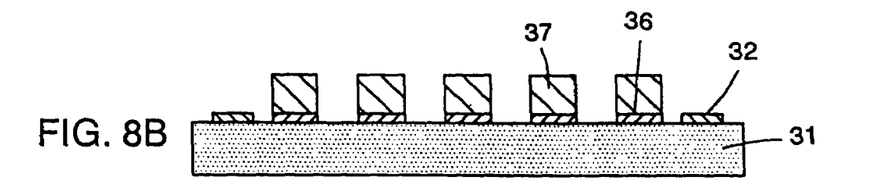
Figure 8C:
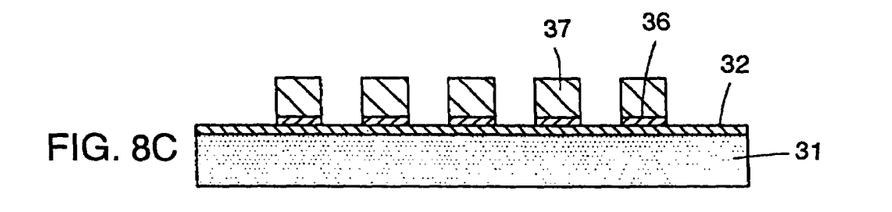

After completion of the washing and the drying of the substrate 31, the whole substrate 31 is immersed into acetone, and an ultrasonic wave is applied to the substrate 31. By applying the ultrasonic wave, the photoresist 33 is peeled off the substrate 31, and at the same time, the plating base film 35 (Au/NiCr film) deposited on the photoresist 33 also is removed via a lift-off process. The state in which only the feeder film 32, the plating base film 36, and the plated wiring 37 thus remain on the surface of the substrate is shown in FIG. 3F, and sectional views thereof are shown in FIGS. 8A to 8C.

Figure 3G:
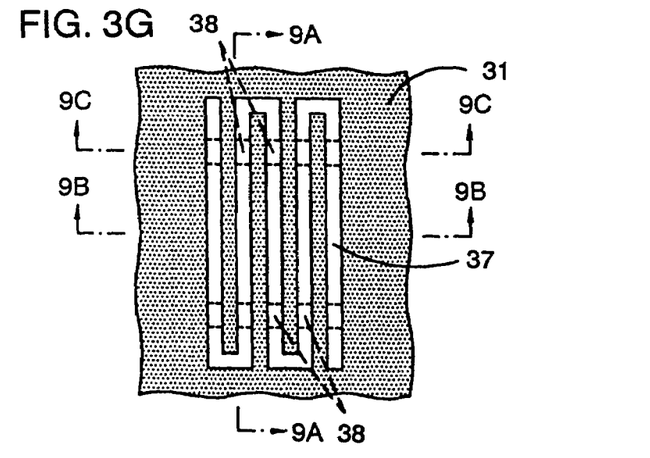

Then, the substrate 31 is immersed into an etchant, for example, hydrofluoric acid, which can selectively remove the feeder film 32 remaining on the plating base film 36 and the plated wiring 37, and the feeder film 32 which is exposed from the plated wiring 37 on the surface of the substrate 31, is selectively removed via etching. As a result, on the surface of the substrate 31, a fine wiring (in particular, fine wiring in which the ratio L/S=5 μm or less), having a structure including a plated Au and a deposited Au/NiCr layer, and composed of the plating base film 36 and the plated wiring 37 is provided. This state is shown in FIG. 3G, and sectional views thereof are shown in FIGS. 9A to 9C.

Figure 9A:
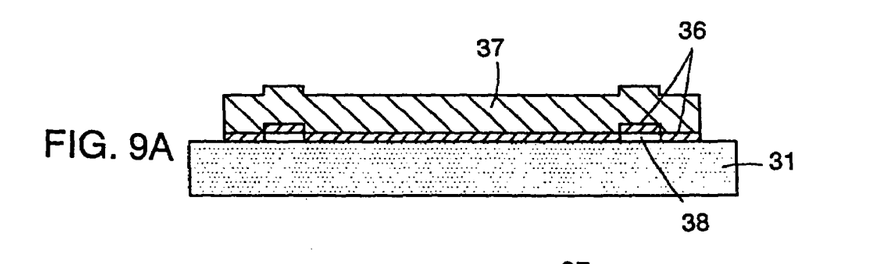
FIGS. 9A to 9C are sectional views taken along lines 9A-9A, 9B-9B and 9C-9C in FIG. 3G, respectively.
Figure 9B:
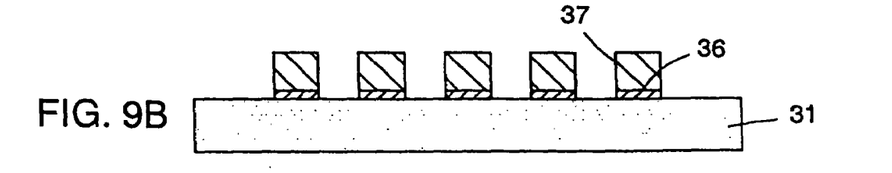
Figure 9C:
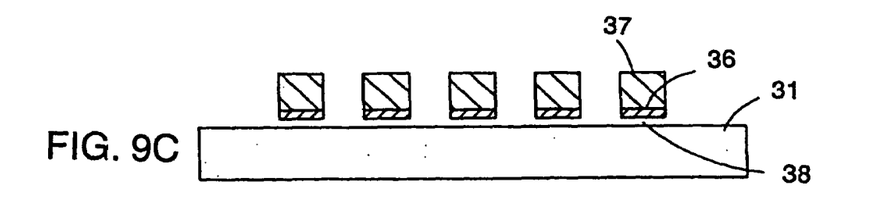

When the exposed portion of the feeder film 32 is thus wet etched, an undercut in the feeder film 32 under the plating base film 36 may be caused (see FIG. 2), or in the case in which the feeder film 32 is completely etched as shown in FIGS. 9A to 9C, a cavity 38 may be caused under the plating base film 36. Because the undercut and the cavity are only caused in a portion of the fine wiring, almost all of the fine wiring is arranged to be closely adhered to the substrate 31, and the fine wiring is not peeled off the substrate 31.

In this preferred embodiment, because the plating base film 36 is formed using the lift-off method, the plating base film 36 having a desired pattern is formed easily and precisely compared to the method in which the plating base film 35 is formed on the whole substrate 31, and thereafter the film 35 is patterned using the etching.

Because the feeder film 32 is removed using the etching, the fine wiring is formed at an arbitrary position and in an arbitrary pattern shape on the substrate 31. Furthermore, because the feeder film 32 is removed using the wet etching, the damage to the substrate 31 can be reduced compared to the case in which the dry etching is used.

Materials for the feeder film 32, the plating base film 35, and the plated wiring 37 are not limited to the aforementioned ones. In order to selectively wet etch the feeder film 32, however, materials used should be different between than the material for the feeder film and the material for the plating base film and the plated wiring. In particular, the feeder film 32 is preferably made of a material that has a high etching rate relating to an etchant that is used, compared to the etching rate of the plating base film 35 and the plated wiring 37.

Figure 10:
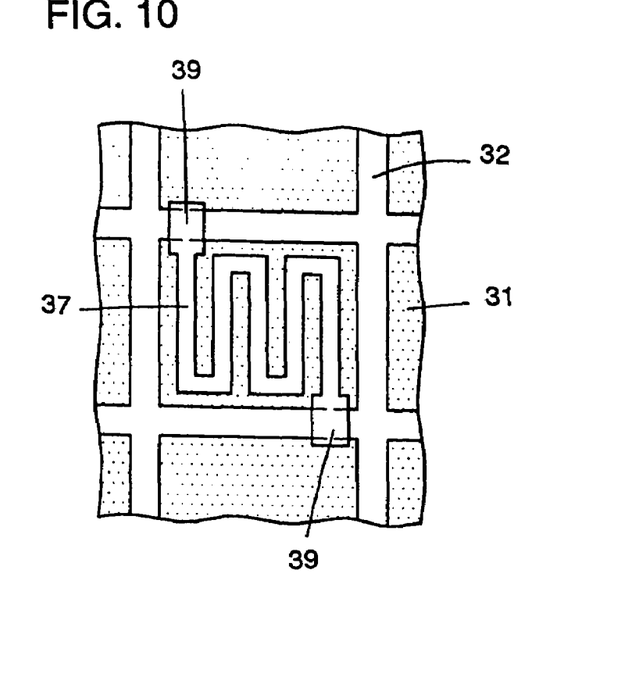
FIG. 10 is a plan view showing a state of after forming a plated wiring and before removing a feeder film in a method of fine wiring formation according to another preferred embodiment of the present invention.

A method of fine wiring formation according to another preferred embodiment of the present invention will be explained with reference to FIGS. 10, 11, 12A to 12C. FIG. 10 is a plan view showing a state in which the photoresist 33 for the lift-off is being peeled after the plated wiring 37 is formed on the plating base film 36. In this preferred embodiment, when the opening 34 is made in the photoresist 33, in a portion 39 through which the feeder film 32 passes, a pattern width of the opening 34 is made to be wide. Therefore, in the portion being stacked on the feeder film 32, each wire width of the plating base film 36 and the plated wiring 37 formed in the opening 34 is made to be wide as shown in FIG. 10.

Figure 11:
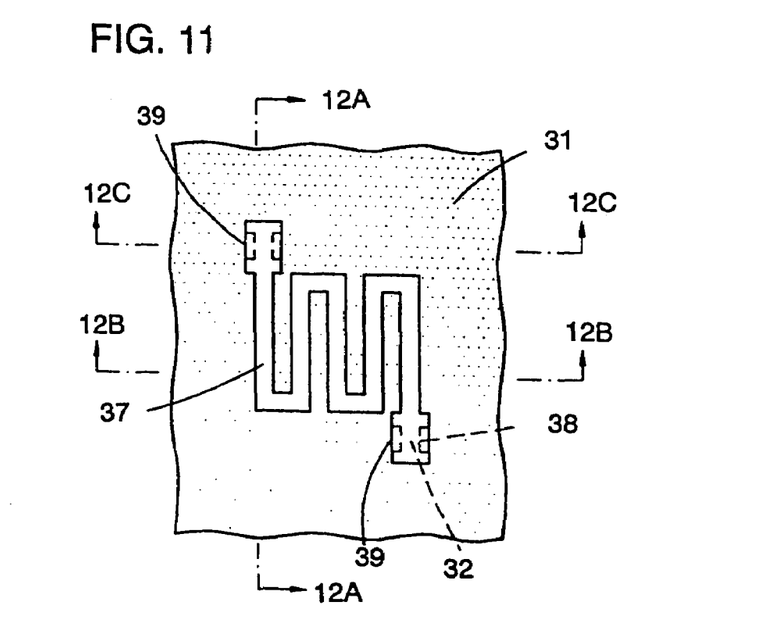
FIG. 11 is a plan view showing a state in which the feeder film shown in FIG. 10 is removed using the etching.
Figure 12A:
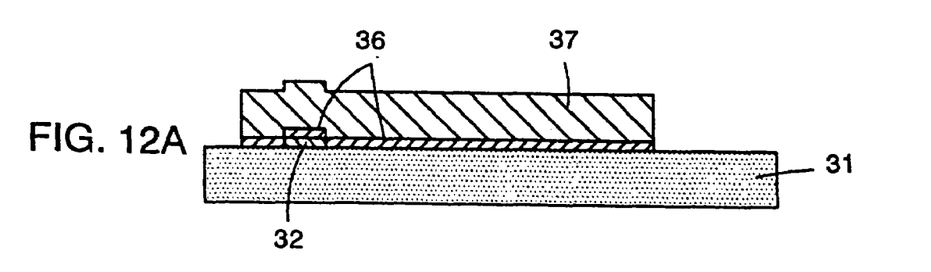
FIGS. 12A to 12C are sectional views taken along lines 12A-12A, 12B-12B and 12C-12C in FIG. 11, respectively.
Figure 12B:
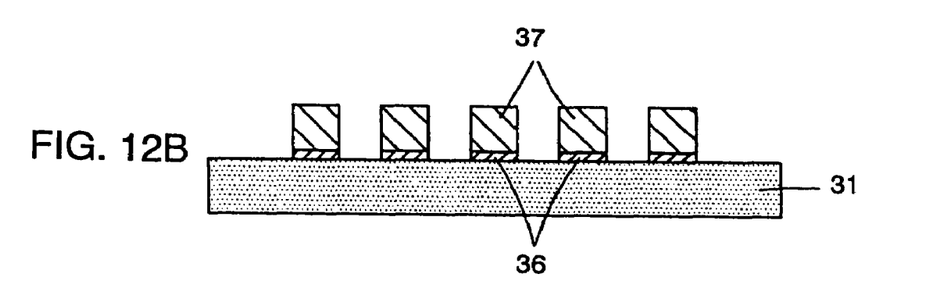
Figure 12C:
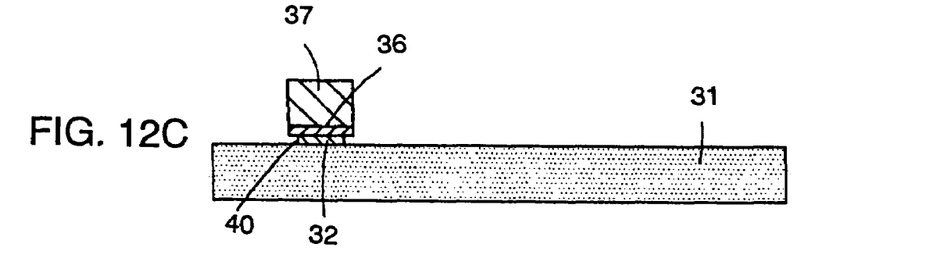

FIG. 11 is a plan view showing a state in which the feeder film 32, exposed out of the plated wiring 37, is removed via etching. The feeder film 32 manufactured as described above is connected to an area that has a relatively wide wire width, for example, an electrode portion of the fine wiring. Therefore, no matter how thin the wire width of the fine wiring in an area that is not stacked on the feeder film 32 is, and even if an undercut 40 were caused by side etching of the feeder film 32 under the plating base film 36 during the selective removal of the feeder film 32, because it is possible that the feeder film 32 remains along the direction of the wire width of the fine wiring, the adhesive strength of the fine wiring is further improved.

The present invention can be applied to an entire wiring pattern or only a portion of the wiring pattern. That is, the fine wiring may be formed according to preferred embodiments of the present invention in a portion that has a relatively narrow wire width, and according to the conventional method in a portion that has a relatively wide wire width. It is not necessary for the feeder film to be continuous. It is desired, however, that when the plating base film is formed, the plating base film and the feeder film are continuous, then the voltage can be applied to the feeder film 32 at a desired point.

While preferred embodiments of the Invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method of wiring formation comprising the steps of:
   forming a resist pattern on a substrate;
   forming a feeder film partially on the substrate in a first pattern after the resist pattern is formed on the substrate;
   removing the resist pattern;
   forming on the substrate a plating base film in a second pattern different from the first pattern, such that a part of the plating base film is formed on top of the feeder film and the remainder is formed directly on the substrate;
   forming a plated wiring on the plating base film in the same pattern as that of the base film using the feeder pattern to connect to a current source; and
   selectively removing at least a portion of the feeder film that is exposed from the plated wiring; wherein
   the first pattern of the feeder film is different from the second pattern of the plating base film.

2. A method of wiring formation according to claim 1, wherein the step of forming on the substrate a plating base film is performed using a physical film making process.

3. A method of wiring formation according to claim 1, wherein the step of forming a plated wiring on the plating base film is performed using an electrolytic plating process.

4. A method of wiring formation according to claim 1, wherein the step of selectively removing at least a portion of the feeder film that is exposed from the plated wiring is performed using a wet etching process.

5. A method of wiring formation according to claim 1, wherein a width of a portion of the plating base film that is stacked on the feeder film is wider than the smallest wire width of the feeder film.

6. A method of wiring formation according to claim 1, wherein the plating base film comprises at least one of an adhesive layer and a diffusion preventive layer.

7. A method according to claim 1, further comprising a step of forming on the substrate another resist pattern having a tapered shape such that a width of openings in the another resist pattern increases towards the substrate.

8. A method according to claim 1, wherein the plating base film comprises an adhesive layer.

9. A method of wiring formation comprising the steps of:
   forming a first resist pattern on a substrate;
   forming a feeder film partially on the substrate in a first pattern after the first resist pattern is formed on the substrate;
   removing the first resist pattern;
   forming on the substrate a second resist pattern which has an opening defining a wiring forming area, such that a portion of the feeder film is exposed from the opening in the second resist pattern;
   forming a plating base film in a second pattern such that a part of the base film is formed on top of the feeder film and the remainder is formed directly on the substrate in the opening;
   forming a plated wiring on the plating base film in the opening using the feeder film to connect to a current source;
   removing the second resist pattern; and selectively removing at least a portion of the feeder film that is exposed from the plated wiring wherein the first pattern of the feeder film is different from the second pattern of the plating base film.

10. A method of wiring formation according to claim 9, wherein the step of forming on the substrate a plating base film is performed using a physical film making process.

11. A method of wiring formation according to claim 9, wherein the step of forming a plated wiring on the plating base film is performed using an electrolytic plating process.

12. A method of wiring formation according to claim 9, wherein the step of selectively removing at least a portion of the feeder film that is exposed from the plated wiring is performed using a wet etching process.

13. A method of wiring formation according to claim 9, wherein a width of a portion of the plating base film that is stacked on the feeder film is wider than the smallest wire width of the feeder film.

14. A method of wiring formation according to claim 9, wherein the plating base film comprises at least one of an adhesive layer and a diffusion preventive layer.

15. A method of manufacturing an electronic component comprising the steps of:
   providing a substrate;
   forming a resist pattern on the substrate;
   forming a feeder film partially on the substrate in a first pattern after the resist pattern is formed on the substrate;
   removing the resist pattern;
   forming on the substrate a plating base film in a second pattern such that a part of the base film is formed on top of the feeder film and the remainder is formed directly on the substrate by using a physical film making process such that the plating base film partially overlaps the feeder film;
   forming a plated wiring on the plating base film using an electrolytic plating process while the feeder film is connected to a current source; and
   selectively removing at least a portion of the feeder film that is exposed from the plated wiring, using a wet etching process;
   wherein the first pattern of the feeder film is different from the second pattern of the plating base film.

16. A method according to claim 15, wherein a width of a portion of the plating base film that is stacked on the feeder film is wider than the smallest wire width of the feeder film.

17. A method according to claim 15, wherein the plating base film comprises at least one of an adhesive layer and a diffusion preventive layer.

18. A method according to claim 17, wherein a width of a portion of the plating base film that is stacked on the feeder film is wider than the smallest wire width of the feeder film.

19. A method of manufacturing an electronic component comprising the steps of:

providing a substrate;

forming a first resist pattern on the substrate;

forming a feeder film partially on a substrate in a first pattern after the first resist pattern is formed on the substrate;

removing the first resist pattern;

forming on the substrate a second resist pattern which has an opening defining a wiring forming area, such that a portion of the feeder film is exposed from the opening in the second resist pattern;

forming a plating base film in a second pattern such that a part of the base film is formed on top of the feeder film and the remainder is formed directly on the substrate in the opening using a physical film making process;

forming a plated wiring on the plating base film in the opening using an electrolytic plating process while the feeder film is connected to a current source;

removing the second resist pattern; and selectively removing at least a portion of the feeder film that is exposed from the plated wiring, using a wet etching; wherein the first pattern of the feeder film is different from the second pattern of the plating base film.

20. A method according to claim 19, wherein a width of a portion of the plating base film that is stacked on the feeder film is wider than the smallest wire width of the feeder film.

21. A method according to claim 19, wherein the plating base film comprises at least one of an adhesive layer and a diffusion preventive layer.

22. A method according to claim 21, wherein a width of a portion of the plating base film that is stacked on the feeder film is wider than the smallest wire width of the feeder film.

* * * * *